United States Patent [19]

Krylow et al.

[11] 3,730,264

[45] May 1, 1973

[54] FRONTAL HEAT EXCHANGER FOR RACKS OF HEAT DISSIPATING APPARATUS

[75] Inventors: Konstanty E. Krylow, Elmhurst; William A. Reimer, Wheaton, both of Ill.

[73] Assignee: GTE Automatic Electric Laboratories Incorporated, Northlake, Ill.

[22] Filed: Oct. 1, 1971

[21] Appl. No.: 185,651

[52] U.S. Cl. .................................165/128, 317/100

[51] Int. Cl. ...............................................H02b 1/00

[58] Field of Search ........................317/100; 62/418; 165/128; 98/40 R

[56] References Cited

UNITED STATES PATENTS 2,189,909 2/1940 Korber et al.......................317/100 X 3,280,377 10/1966 Harris et al...........................317/100

3,387,648 6/1968 Ward, Jr. et al..................317/100 X

*Primary Examiner*—Meyer Perlin

*Assistant Examiner*—Peter D. Ferguson

*Attorney*—K. Mullerheim et al.

[57] ABSTRACT

A frontal heat exchanger for electronic systems is provided by a V-shaped, inclined deflector disposed between vertically adjacent arrays of heat dissipating apparatus. Heated air moving upward by convection is directed from the electronic system while cool air is drawn into the system over the upper surface of the deflector.

4 Claims, 4 Drawing Figures

INVENTORS
KONSTANTY E. KRYLOW
WILLIAM A. REIMER
BY Robert Van Epps
ATTORNEY

FRONTAL HEAT EXCHANGER FOR RACKS OF HEAT DISSIPATING APPARATUS

BACKGROUND OF THE INVENTION

1. Field of the Invention

The present invention relates most generally to the field of heat transfer and more particularly to a heat exchanger for racks of electrical apparatus.

2. Description of the Prior Art

In modern electronic systems, rack-mounted electronics typically dissipate large amounts of heat into the relatively confined volume of the system's outer package. To prolong the lifetime of the electronic components it is thus imperative that heat dissipated by these components be removed from the immediate system environment as efficiently as possible. A variety of electronic system cooling schemes have been devised using both forced and free convection principles. Typical of a free convection arrangement is that described in U.S. Pat. No. 3,280,377 which issued to A. E. Harris et al on Oct. 18, 1966 and wherein electrical apparatus is mounted on racks which are inclined front-to-back. Vertically adjacent racks form air flow passages through which cooling air is passed. In many modern electronic systems the wiring card files are completely enclosed from the rear by a solid printed wiring board which serves as an electrical ground plane and inflow of air from the front of the file assembly is limited by an almost solid wall of wiring card handles. Any heat exchange arrangement which relies upon front-to-back convection air flow is thus of limited capacity.

OBJECTS AND SUMMARY OF THE INVENTION

From the foregoing discussion it will be understood that among the various objectives of the present invention are:

- to provide a new and novel heat exchanger for racks of electrical apparatus,
- to provide apparatus of the above-described character which deflects hot air rising by convection from the underside thereof and draws cooling air into the electrical apparatus over the upper side thereof, and
- to provide apparatus of the above-described character having efficient heat exchange properties.

These and other objectives of the present invention are efficiently achieved by providing an inclined V-shaped air deflector disposed between vertically adjacent arrays of heat dissipating elements. Hot air rising by convection follows the inclined surfaces of the deflector to the front and sides of the array and fresh air is drawn by convection over the top of the deflector into the next upper array of heat dissipators.

The foregoing as well as other objects, features and advantages of the present invention will become more apparent from the following detailed description taken in conjunction with the appended drawings.

DESCRIPTION OF PREFERRED EMBODIMENT

Figure 1A:
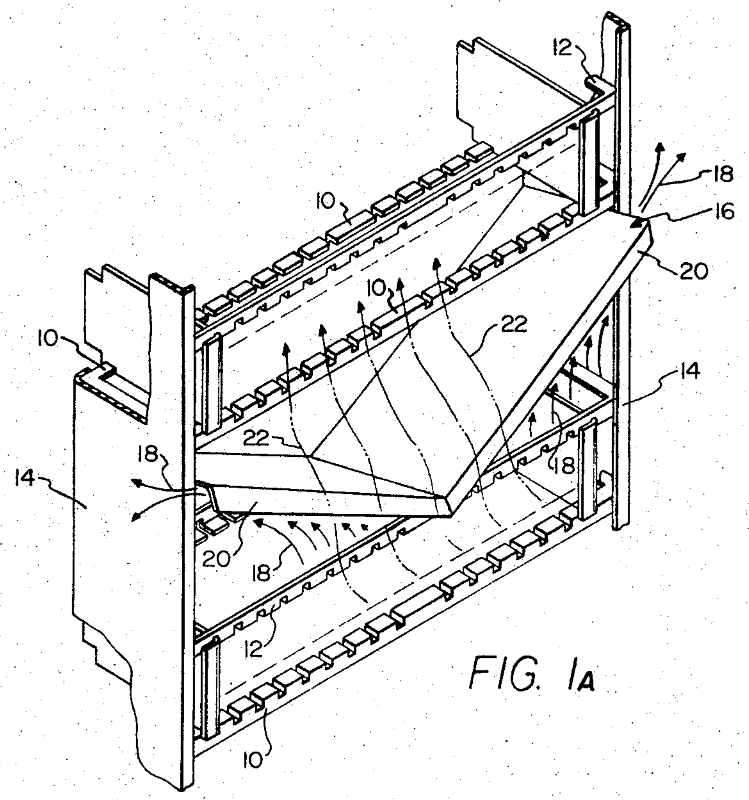
FIGS. 1A, 1B and 1C are perspective, front and side views respectively of a frontal heat exchanger in accordance with the principles of the present invention.
Figure 1B:
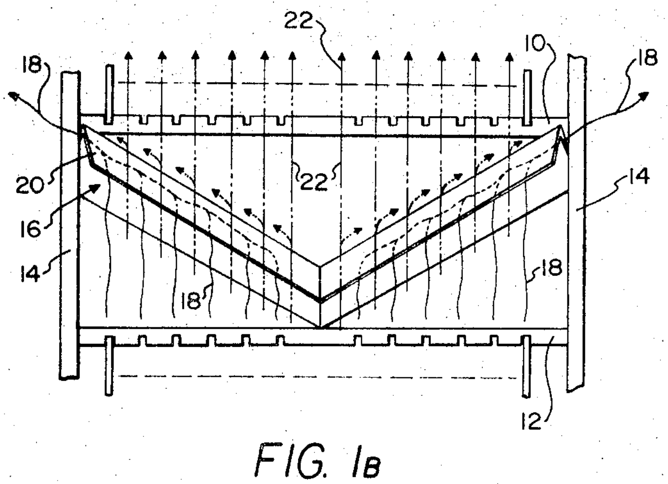
Figure 1C:
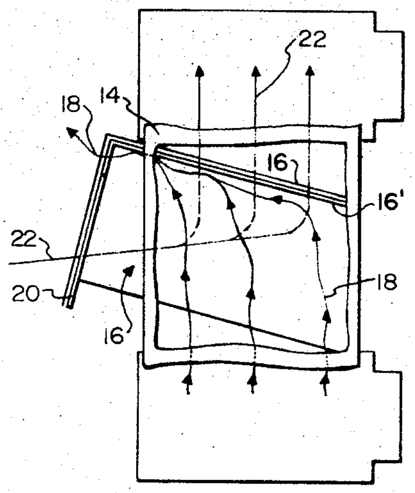

Turning now to FIGS. 1A–1C there are illustrated three views of a frontal heat exchanger within the contemplation of the present invention and wherein like features are identified by like reference numerals. An enclosure is formed by the bottom and top surfaces of vertically adjacent printed wiring card files 10 and 12 respectively which are affixed to end supports 14 in any conventional manner. The card files 10 and 12 typically will have passages through which cooling air may pass vertically through the electronic components (not shown). The heat exchanging air deflector comprises a generally V-shaped plate 16 interposed between two vertically adjacent wiring card files. The plate 16 is inclined with respect to the card files such that the front edge is slightly higher than the rear edge. Hot air represented by solid arrows 18 rising by free convection from the bottom card file 12 follows the inclined surfaces of the plate 16 toward the front and to the sides thereof. The plate 16 preferably extends beyond the front of the card files and is provided with a downwardly extending flap 20 at its front edge to prevent hot air from spilling out along the front of the heat exchanger. Hot air is thus exhausted from the card file at the edges thereof. Since the next vertically adjacent card file 10 also is a heat dissipator, the updraft created thereby will draw fresh air, represented by broken arrows 22, over the upper surface of plate 16 and into file 10.

Although the heat exchanging air deflector plate 16 may be formed of any convenient substantially air-impervious material it is preferred in the practice of this invention that a thermally insulative material be used to prevent upward heat transfer by conduction. Alternatively a combination or laminate of thermally conductive and non-conductive materials may be used as illustrated at 16 and 16' of FIG. 1C. In such a case the thermally conductive layer would be disposed toward the heated air to minimize conductive heat transfer.

Figure 2:
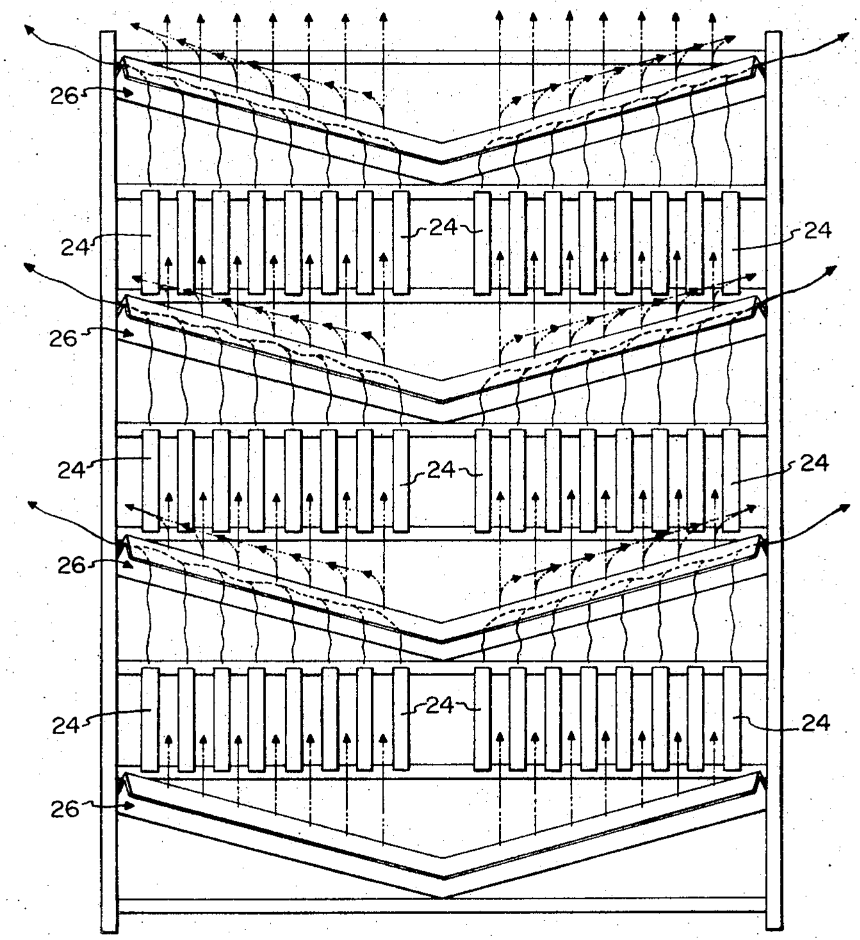
FIG. 2 is a front view of a rack of electrical apparatus provided with heat exchangers of the type illustrated in FIGS. 1A–C.

FIG. 2 more graphically illustrates in a front elevation view a printed wiring card file incorporating the improvement of the present invention. The file includes a vertically distributed array of heat dissipating elements 24 such as electronic components with frontal heat exchanging deflector plates 26 interspersed in the array at any desired frequency. In this manner warm air may be removed as frequently as necessary to prevent its flowing over the elements above and maintain the card file temperature at a desired operating temperature.

From the foregoing it will be understood that the Applicants have provided a very simple and economical means for removing heated air from racks of electronic components wherein substantial airflow is available only through the front surface of the rack. Since certain changes in the above-described construction will occur to those skilled in the art without departure from the scope of the invention it is intended that all matter contained in the above-description or shown in the appended drawings shall be interpreted as illustrative and not in a limiting sense.

Having described what is new and novel and desired to secure by Letters Patent, what is claimed is:

1. A heat exchanging air deflector for convective air currents in combination with a vertically distributed array of heat dissipating elements disposed in a supporting means, said deflector comprising:

a substantially air-impervious deflector plate disposed in said supporting means between two vertically adjacent heat dissipating elements of said array at an incline both front-to-back and side-to-side, and having a downwardly extending deflector tab affixed to the forward edge thereof such that warm air rising by convection follows said incline to the front and side of said deflector plate, and is exhausted from said array, and relatively cooler air is drawn into said array over the upper surface of said deflector plate.

2. Apparatus as recited in claim 1 wherein:

said deflector plate is inclined upwardly toward each end thereof from an axis intermediate said ends.

3. Apparatus as recited in claim 1 wherein:

said deflector plate is formed of a thermally insulative material.

4. Apparatus as recited in claim 1 wherein:

said deflector plate is formed of alternating parallel layers of thermally conductive and thermally insulative material, said thermally conductive layer being disposed toward said rising warm air.

* * * * *